US009438492B2

(12) United States Patent
Indovina et al.

(10) Patent No.: US 9,438,492 B2
(45) Date of Patent: *Sep. 6, 2016

(54) SELF-ORGANIZED MULTIPLE APPLIANCE NETWORK CONNECTIVITY APPARATUS

(71) Applicant: Tenrehte Technologies, Inc., Rochester, NY (US)

(72) Inventors: Mark Allen Indovina, Rochester, NY (US); Jennifer Marie Indovina, Rochester, NY (US); Russell Dean Priebe, Pflugerville, TX (US); Carlos Antonio Barrios, Rochester, NY (US); Steven Lee Boggs, Scottsville, NY (US)

(73) Assignee: Tenrehte Technologies, Inc., Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,014

(22) Filed: Oct. 17, 2015

(65) Prior Publication Data

US 2016/0043918 A1    Feb. 11, 2016

Related U.S. Application Data

(63) Continuation of application No. 13/306,976, filed on Nov. 29, 2011, now Pat. No. 9,197,949.

(60) Provisional application No. 61/419,214, filed on Dec. 2, 2010.

(51) Int. Cl.
*G06F 1/00* (2006.01)
*H04L 12/26* (2006.01)
(Continued)

(52) U.S. Cl.
CPC ....... *H04L 43/065* (2013.01); *G01R 19/16528* (2013.01); *G01R 19/2513* (2013.01);
(Continued)

(58) Field of Classification Search
CPC ....... G06F 1/3203; H02J 3/14; H02J 3/0079; H04Q 9/00; H04Q 2209/86; Y02B 90/2669; Y04S 40/128

See application file for complete search history.

(56) References Cited

U.S. PATENT DOCUMENTS

| 4,644,320 A | 2/1987 | Carr et al. |
| 4,858,141 A | 8/1989 | Hart et al. |

(Continued)

FOREIGN PATENT DOCUMENTS

| JP | 2002-044882 A | 2/2002 |
| JP | 2006-109389 A | 4/2006 |

OTHER PUBLICATIONS

"Notification Concerning Transmittal of International Preliminary Report for Patentability(Chapter I of the Patent Cooperation Treaty)" for PCT/US2011/062485, Jun. 13, 2013, 6 pages, International Bureau of WIPO, Geneva, Switzerland.

(Continued)

*Primary Examiner* — Mohammed Rehman
*Assistant Examiner* — Gayathri Sampath
(74) *Attorney, Agent, or Firm* — Kurt Rauschenbach; Rauschenbach Patent Law Group, LLC

(57) ABSTRACT

An appliance network connectivity apparatus includes a voltage sensor that generates a signal at an output that is proportional to a voltage provided to the appliance. A current sensor generates a signal at an output that is proportional to a current flowing through the appliance. A processor determines the electrical characteristics of power consumed by the appliance and executes web server software for communicating data through a network. A relay controls power from the power source to the appliance. A memory stores the electrical characteristics. A network interface provides the electrical characteristics to the network.

22 Claims, 6 Drawing Sheets

(51) Int. Cl.
  *G06F 1/32* (2006.01)
  *H02J 3/14* (2006.01)
  *H02J 13/00* (2006.01)
  *H04Q 9/00* (2006.01)
  *G01R 19/25* (2006.01)
  *G01R 19/165* (2006.01)

(52) U.S. Cl.
  CPC ............... *G06F1/3203* (2013.01); *H02J 3/14* (2013.01); *H02J 13/0079* (2013.01); *H04L 43/08* (2013.01); *H04Q 9/00* (2013.01); *H02J 2003/143* (2013.01); *H04Q 2209/40* (2013.01); *H04Q 2209/43* (2013.01); *H04Q 2209/84* (2013.01); *H04Q 2209/86* (2013.01); *Y02B 90/2669* (2013.01); *Y04S 40/128* (2013.01)

(56) References Cited

U.S. PATENT DOCUMENTS

| | | |
|---|---|---|
| 4,977,515 A | 12/1990 | Rudden et al. |
| 5,650,771 A | 7/1997 | Lee |
| 5,699,051 A | 12/1997 | Billig et al. |
| 5,818,725 A | 10/1998 | McNamara et al. |
| 5,956,487 A | 9/1999 | Venkatraman et al. |
| 6,226,600 B1 | 5/2001 | Rodenberg et al. |
| 6,993,417 B2 | 1/2006 | Osann, Jr. |
| 7,039,529 B2 | 5/2006 | Keech |
| 7,058,524 B2 | 6/2006 | Hayes et al. |
| 7,317,404 B2 | 1/2008 | Cumeralto et al. |
| 7,460,930 B1 | 12/2008 | Howell et al. |
| 7,555,365 B2 | 6/2009 | Bhakta et al. |
| 2002/0124081 A1* | 9/2002 | Primm ............... H04L 29/06 709/224 |
| 2003/0126253 A1* | 7/2003 | Ewing ............... G06F 1/26 709/223 |
| 2009/0009287 A1 | 1/2009 | Falcioni et al. |
| 2010/0005331 A1 | 1/2010 | Somasundaram et al. |
| 2010/0088261 A1* | 4/2010 | Montalvo ............... H02J 3/14 706/15 |
| 2010/0174419 A1 | 7/2010 | Brumfield et al. |
| 2010/0217450 A1* | 8/2010 | Beal ............... H02J 3/14 700/291 |
| 2011/0172841 A1* | 7/2011 | Forbes, Jr. ............... G01D 4/004 700/292 |
| 2012/0226764 A1* | 9/2012 | Philip ............... H04L 67/125 709/208 |
| 2012/0259476 A1* | 10/2012 | Trieb ............... G06F 1/28 700/295 |

OTHER PUBLICATIONS

"Notification of Transmittal of The International Search Report and The Written Opinion of The International Searching Authority, or The Declaration" for PCT/US2011/062485, Jun. 14, 2012, 9 pages, The International Searching Authority/Korean Intellectual Property Office, Seo-gu, Daejeon, Republic of Korea.

* cited by examiner

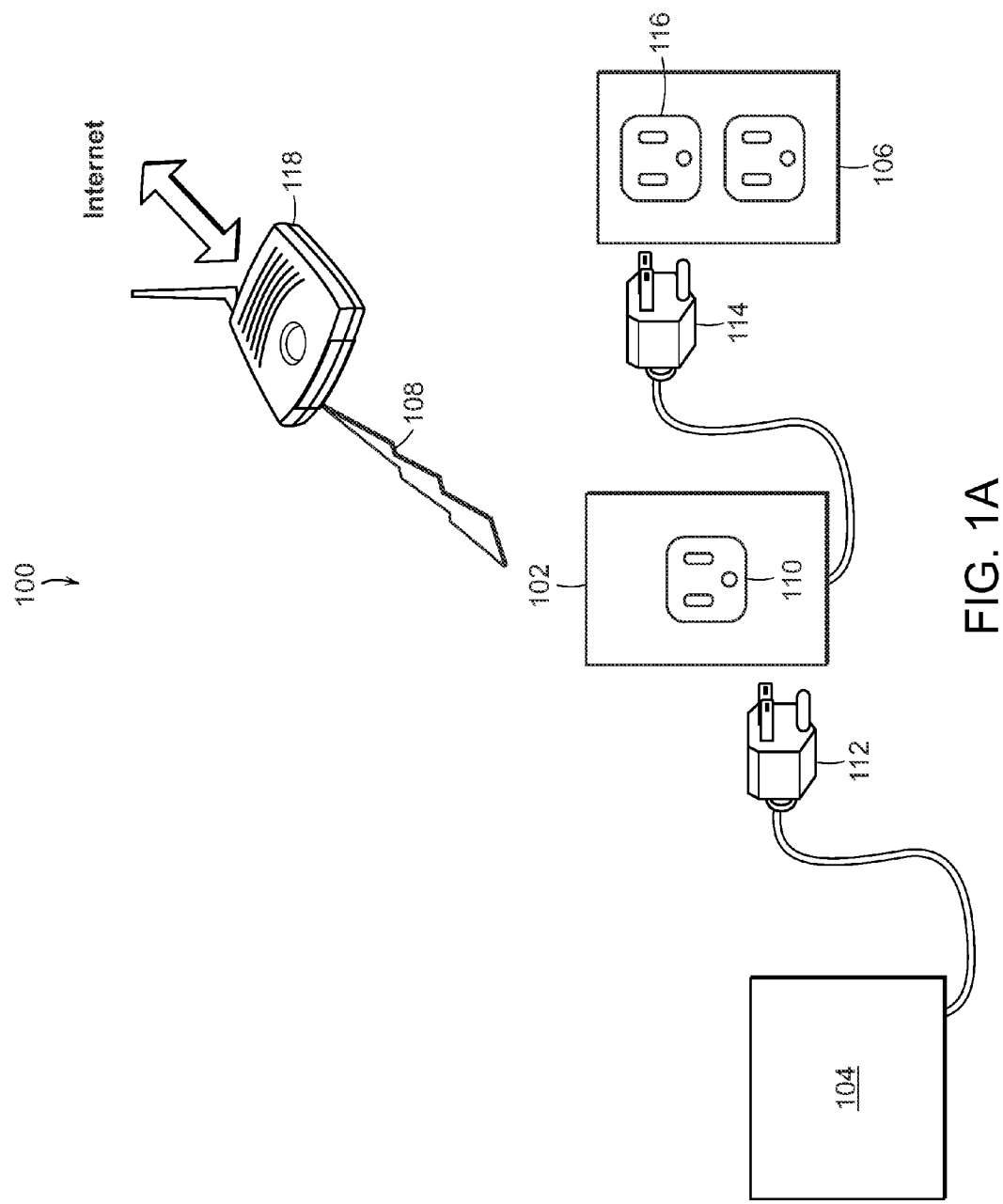

SELF-ORGANIZED MULTIPLE APPLIANCE NETWORK CONNECTIVITY APPARATUS

CROSS-REFERENCE TO RELATED APPLICATIONS

The present application is a continuation of U.S. patent application Ser. No. 13/306,976, filed on Nov. 29, 2011, which is a non-provisional of U.S. Provisional Patent Application Ser. No. 61/419,214, filed on Dec. 2, 2010. The entire contents of U.S. patent application Ser. No. 13/306,976 and U.S. Patent Application Ser. No. 61/419,214 are herein incorporated by reference.

The section headings used herein are for organizational purposes only and should not to be construed as limiting the subject matter described in the present application in any way.

INTRODUCTION

Recently, smart electrical power grid technology has been rapidly developing. The term "smart grid" as used herein refers to a modernization of the electrical power delivery system to implement various functions, such as monitoring and protecting as well as to automatically optimize the operation of interconnected devices. Smart grid technology can be implemented anywhere in the electrical power delivery systems, such as from the central and distributed generator through the high-voltage transmission and distribution system. Also, smart grid technology can be implemented in building automation systems, energy storage installations, and in end-user industrial and residential customer facilities.

Smart grid technology generally includes a two-way flow of electrical signals that includes information and power that is used to create an automated, widely distributed energy delivery system. One important aspect of the smart grid is the capability to monitor energy usage of individual appliances, devices, and industrial machinery. Another aspect of the smart grid is demand response, which is the ability to manage consumption in response to pricing spikes or requests from utilities to reduce peak demand. Additionally, manufacturers of appliances, devices, and machines can use the same smart grid technology for energy monitoring, demand response, and diagnostics. In addition, end users can deploy smart grid technology for energy monitoring, demand response, and remote operations, such as powering off and on.

Utility companies are increasingly providing incentives for business and residential customers to reduce energy use during peak demand periods or when power reliability is at risk. One important application of smart grid technology is distributed systems and communication systems that deliver real-time information and enable near-instantaneous balance of supply and demand at the device level. Similarly studies have shown that energy usage feedback can motivate consumers to reduce consumption.

It is highly desirable to facilitate the implementation of smart grid technology in appliances in homes, offices, government, and other public buildings, and factories in order to monitor energy usage, perform diagnostics, demand response, and to perform remote operations such as powering on and off.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The skilled person in the art will understand that the drawings, described below, are for illustration purposes only. The drawings are not necessarily to scale, emphasis instead generally being placed upon illustrating principles of the teaching. The drawings are not intended to limit the scope of the Applicant's teaching in any way.

FIG. 1A is an illustration of one embodiment of an appliance network connectivity apparatus according to the present teaching that includes a plug adapter that is electrically connected between an appliance and an electrical power outlet and that communicates via a wireless network.

DESCRIPTION OF VARIOUS EMBODIMENTS

Figure 1B:
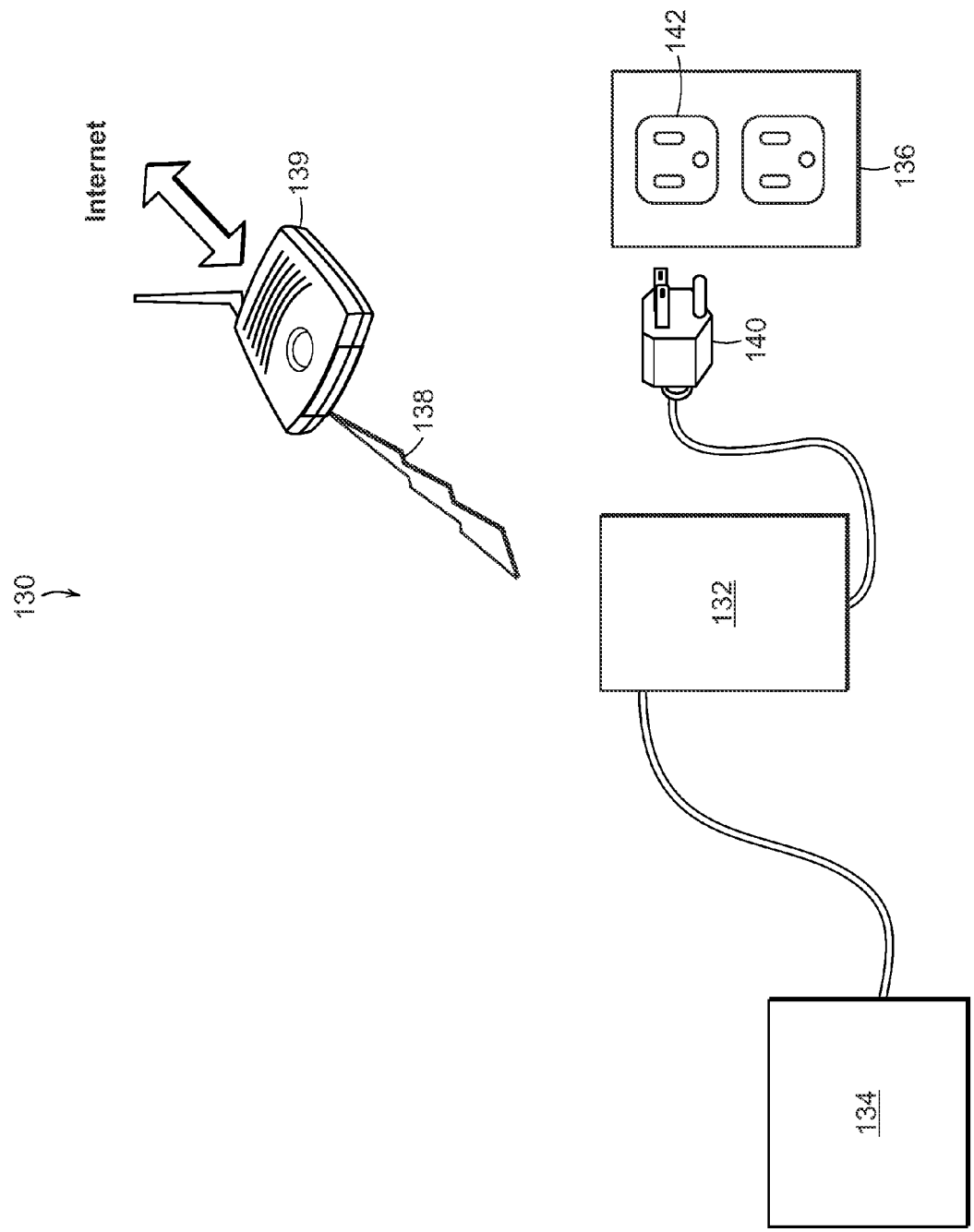
FIG. 1B is an illustration of another embodiment of an appliance network connectivity apparatus according to the present teaching that includes a hardwired adaptor that is electrically connected between an appliance and an electrical power outlet and that communicates via a wireless network.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teachings may be performed in any order and/or simultaneously as long as the teaching remains operable. Furthermore, it should be understood that the apparatus and methods of the present teachings can include any number or all of the described embodiments as long as the teaching remains operable.

The present teaching will now be described in more detail with reference to exemplary embodiments thereof as shown in the accompanying drawings. While the present teachings are described in conjunction with various embodiments and examples, it is not intended that the present teachings be limited to such embodiments. On the contrary, the present teachings encompass various alternatives, modifications and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching relates to methods and apparatus for facilitating smart grid technology. One aspect of the present teaching relates to methods and apparatus for monitoring and controlling one or more appliances in homes, businesses (including government businesses and other public buildings), and factories. Many future appliances will have hardware and software that allows them to be connected to smart grid technology. However, the vast majority of installed industrial and consumer appliances do not have the hardware and software necessary to be connected to smart grid technology. Some of the methods and apparatus of the present teaching relate to retrofitting existing appliances for smart grid technology.

The term "appliance" as used herein refers to numerous types of electrically powered equipment that one skilled in the art would normally consider to be an appliance, such as consumer home appliances like refrigerators, washers, dryers, water heaters, air conditioners, and consumer electronic devices, such as computers, televisions, audio equipment. In addition, the term "appliance" as used herein refers to any device that consumes electrical power and that can be connected to an electrical power delivery system in any manner. In particular, the term "appliance" as used herein refers to numerous types of industrial machinery.

The term "network" as used herein refers to numerous types of communication networks that one skilled in the art would normally consider to be a collection of devices interconnected by communication channels which enable access to resources and information. Some aspects of the present teachings are described in conjunction with a wireless network. It should be understood that any type of wireless network can be used such as wireless RF and free space optical networks. In addition, it should be understood, that many of the teachings of the present invention also apply to an entirely hardwired electrical and optical network.

FIG. 1A is an illustration of one embodiment of an appliance network connectivity apparatus 100 according to the present teaching that includes a plug adapter 102 that is electrically connected between an appliance 104 and an electrical power outlet 106 and that communicates via a wireless network 108. Some aspects of the present teachings are described in conjunction with the wireless network 108 providing access to the internet. It should be understood that the wireless network 108 can provide access to various network topologies including, but not limited to, a local area network (LAN), a wide area network (WAN), a campus area network (CAN), a metropolitan area network (MAN), and the internet. The plug adapter 102 includes a female power receptacle 110 that is designed to receive a male power cord plug 112 that powers the appliance 104. The plug adapter 102 also includes a male power cord 114 that is designed to plug into a power cord female receptacle 116 of the electrical outlet 106. One skilled in the art will appreciate that the power cord plugs described herein can be any type of plug (standard or custom), such as standard 110V and 220V plugs single-phase and three-phase that are widely used in North America. In addition, the plug adaptor 102 also includes a wireless interface that communicates with the wireless network 108 via a routing and/or switching device 118.

FIG. 1B is an illustration of another embodiment of an appliance network connectivity apparatus 130 according to the present teaching that includes a hardwired adaptor 132 that is electrically connected between an appliance 134 and an electrical power outlet 136 and that communicates via a wireless network 138 through a routing and/or switching device 139. The appliance network connectivity apparatus 130 is similar to the appliance network connectivity apparatus 100 that was described in connection with FIG. 1A except that the hardwired adaptor 132 does not include a female receptacle that is designed to receive a male power cord plug that powers the appliance 134. Instead, the hardwired adaptor 132 electrically connects the appliance 134 to the male power cord 140 that plugs into the female receptacle 142 of the electrical outlet 136. This embodiment of the appliance network connectivity apparatus 130 is useful for many applications where appliances, such as industrial or stationary equipment, are hardwired. For example, many three-phase powered industrial appliances are hardwired. This embodiment of the appliance network connectivity apparatus 130 may also include applications whereby the hardwired adaptor 132 is completely enclosed within the structure of the appliance.

Figure 1C:
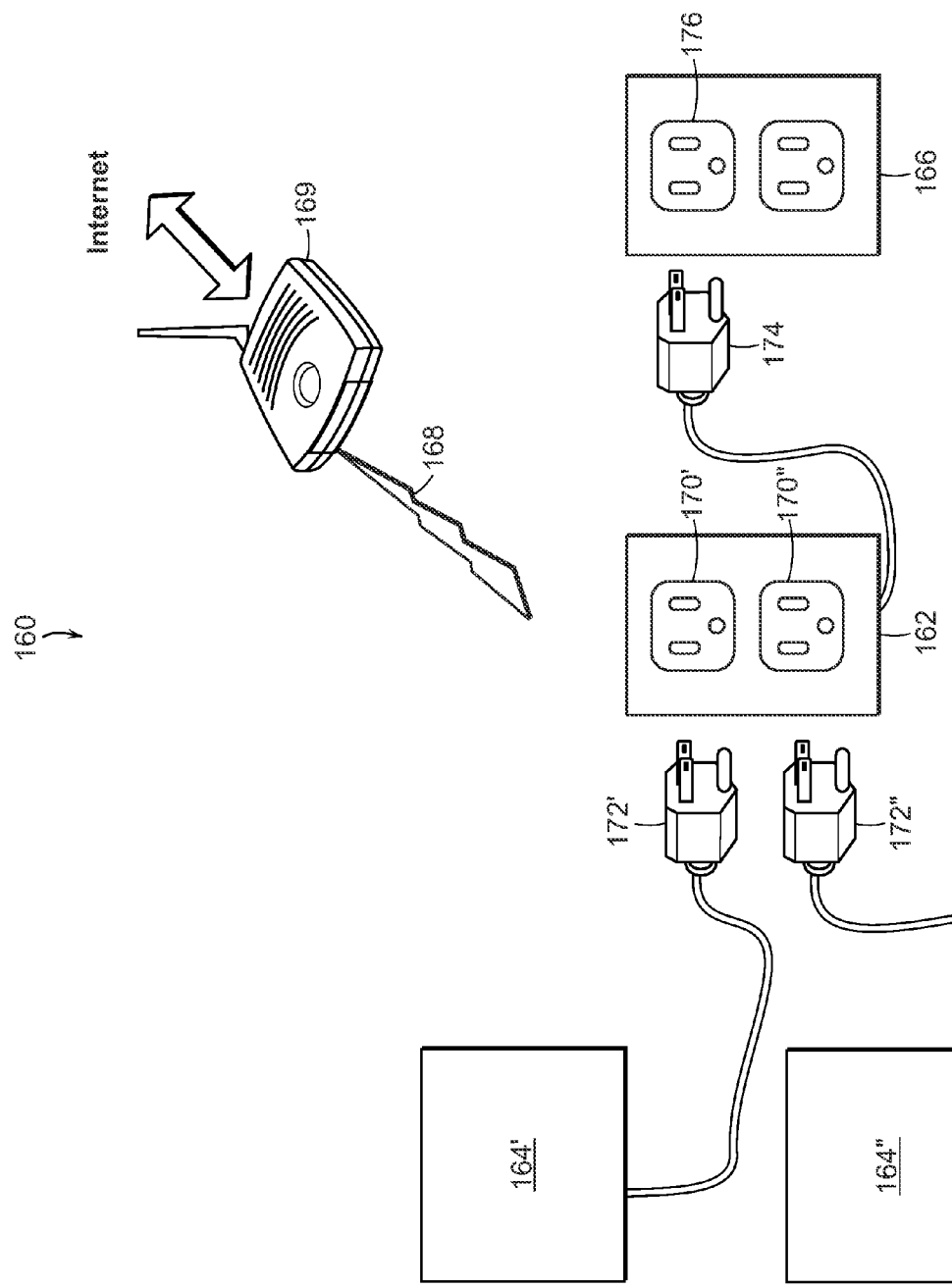
FIG. 1C is an illustration of another embodiment of an appliance network connectivity apparatus according to the present teaching that includes a multiple plug adapter that is electrically connected between an appliance and an electrical power outlet and that communicates via a wireless network.

FIG. 1C is an illustration of another embodiment of an appliance network connectivity apparatus 160 according to the present teaching that includes a multiple plug adapter 162 that is electrically connected between multiple appliances 164 and an electrical power outlet 166 and that communicates via a wireless network 168 through a routing and/or switching device 169. The appliance network connectivity apparatus 160 is similar to the appliance network connectivity apparatus 100 that was described in connection with FIG. 1A. However, the appliance network connectivity apparatus 160 is a single appliance network connectivity apparatus that can support multiple appliances.

The plug adapter 162 includes multiple female power receptacles 170 that are designed to receive multiple male power cord plugs 172 that power each of the multiple appliances 164. The plug adapter 162 also includes a male power cord 174 that is designed to plug into a female power receptacle 176 of the electrical outlet 166. One skilled in the art will appreciate that the plug adapter 162 can also be hardwired into an electrical power source.

Figure 1D:
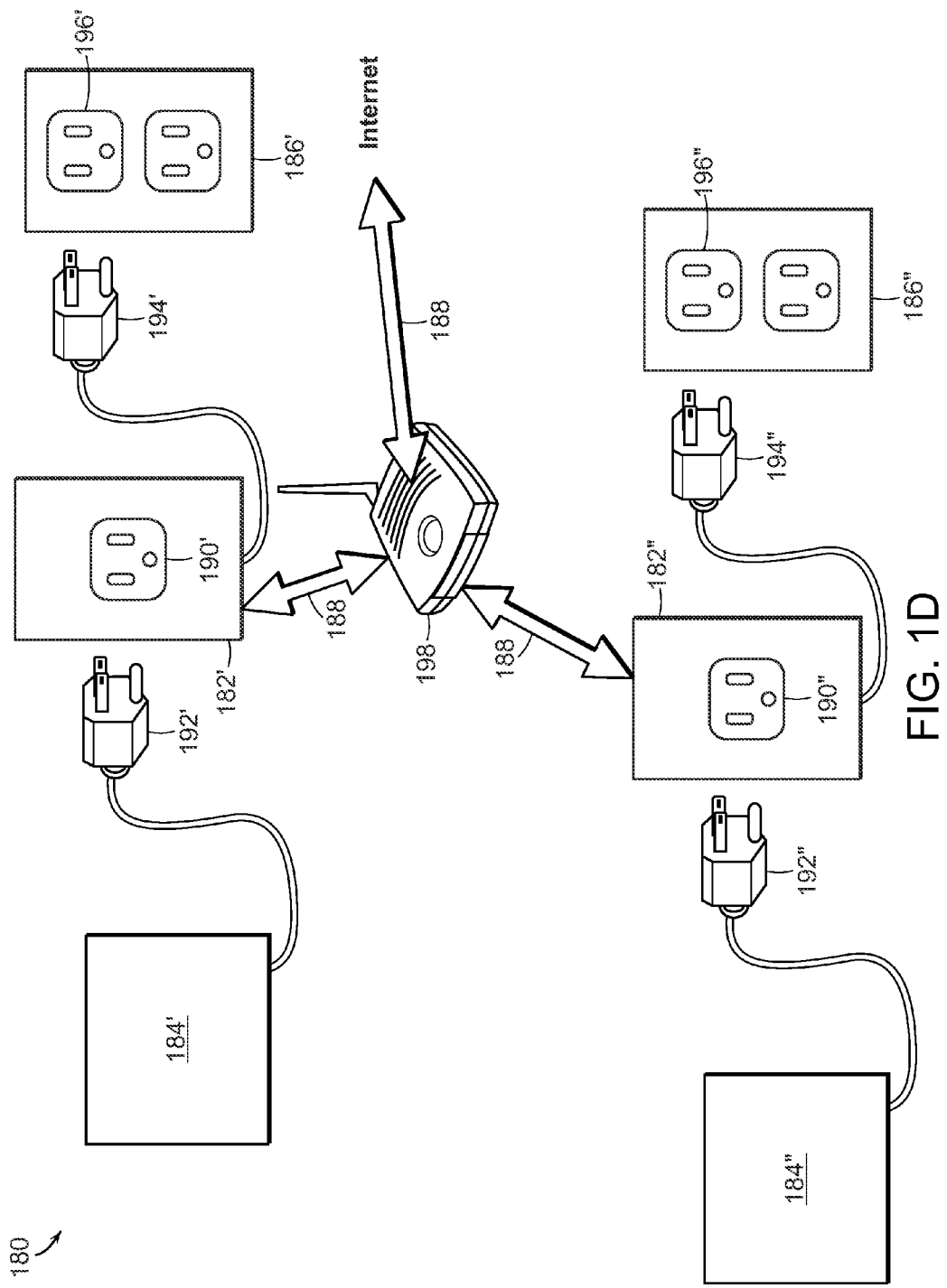
FIG. 1D is an illustration of another embodiment of an appliance network connectivity apparatus according to the present teaching that includes multiple plug adapters that are each electrically connected between an appliance and an electrical power outlet and that communicates via a wireless network.

FIG. 1D is an illustration of another embodiment of an appliance network connectivity apparatus 180 according to the present teaching that includes multiple plug adapters 182', 182" that are each electrically connected between appliances 184', 184" and electrical power outlets 186', 186" that each communicates via a wireless network 188 enabling communication with each other. The appliance network connectivity apparatus 180 is similar to the appliance network connectivity apparatus 100 described in connection with FIG. 1A. However, there are multiple plug adapters 182', 182" that can communicate with each other via a routing and/or switching device 198. One skilled in the art can appreciate that the appliance network connectivity apparatus 180 can be scaled to accommodate any number of plug adapters powering any number of appliances.

The plug adapters 182', 182" each include a female power receptacle 190', 190" that is designed to receive a male power cord plug 192', 192" that powers the appliances 184' 184". The plug adapters 182', 182" also include a male power cord 194', 194" that is designed to plug into a power cord female receptacle 196', 196" of the electrical outlets 186', 186". The plug adapters 182', 182" communicate with each other via the wireless network 188 and via a routing and/or switching device 198.

Figure 2A:
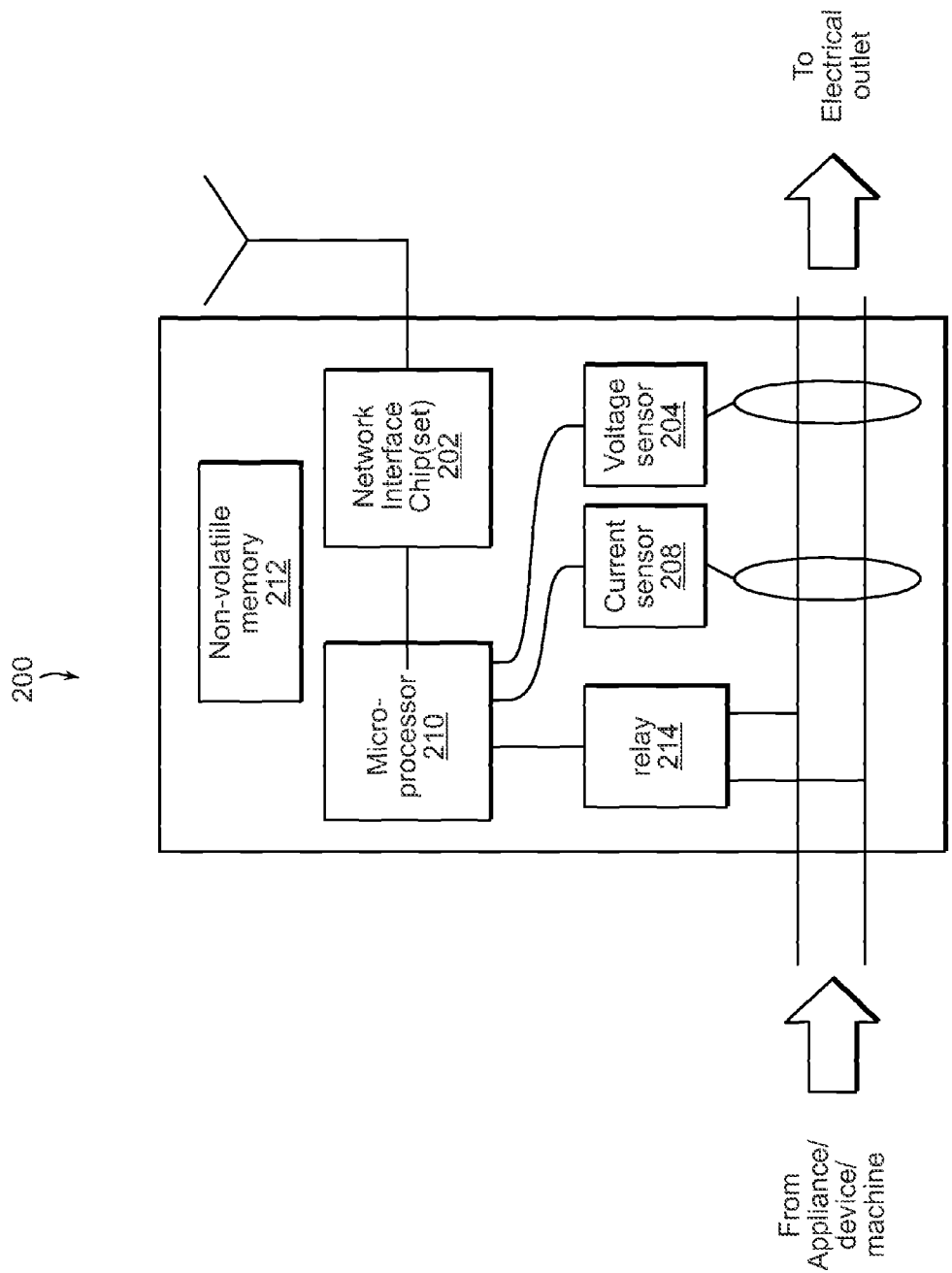
FIG. 2A is a schematic block diagram of an appliance network connectivity apparatus according to the present teaching that includes a wireless network interface.

FIG. 2A is a schematic block diagram of an appliance network connectivity apparatus 200 according to the present teaching that includes a wireless network interface 202. Referring to FIGS. 1A and 2A, in one embodiment, the appliance network connectivity apparatus 200 includes an electrical female receptacle 110 that receives an appliance power plug 112 that powers the appliance 104. In another embodiment, the appliance network connectivity apparatus 200 is hardwired to an electrical power source as shown in FIG. 1B.

The appliance network connectivity apparatus 200 includes a voltage sensor 204 that is electrically coupled to an output of a power source 116 which provides power to the appliance network connectivity apparatus 200. The voltage sensor 204 generates a signal at an output that is proportional to a voltage provided to the appliance 104. A current sensor 208 is also electrically coupled to the output of the power source 116. The current sensor 208 generates a signal at an output that is proportional to a current flowing through the appliance 104.

A processor 210 controls the operation of the appliance network connectivity apparatus 200. The processor 210 includes a first sensor input that is electrically coupled to the output of the voltage sensor 204 and a second sensor input that is electrically coupled to the output of the current sensor 208. The processor 210 manages the voltage sensor 204 and current sensor 208 by controlling the sampling of current and voltage measurements as well as storage of the current and voltage samples in the memory 212.

The processor 210 can perform multiple functions. For example, the processor 210 can determine the power consumed by the appliance, line voltage, instantaneous power, resistive power, reactive power, and power factor as a function of time. In addition, the processor 210 can monitor and store current. One skilled in the art will appreciate that the processor 210 can determine numerous other electrical characteristics data of the appliance. The processor 210 also manages recorded sensor measurement data. The processor 210 also determines appliance diagnostics information and appliance usage data. Furthermore, the processor 210 can perform on-board diagnostics to monitor the performance or condition of the connected appliance. The diagnostic data can be recorded, used to trigger local or remote alarms (not shown), and can be communicated with the appliance vendor (not shown).

In addition, the processor 210 or a separate processor (not shown) executes web server software that communicates the electrical characteristics data through the wireless network 108 to the routing and/or switching device 118 where it is available to a web browser so it can be presented in a web page. The web page can also be programmed to provide information (both tabular and graphical) on such measures as instantaneous power consumption, cumulative power consumption, length of time of operation, and any number of other significant metrics.

The processor 210 is electrically connected to a non-volatile memory 212 that stores the electrical characteristics data of the appliance. The memory 212 or a separate memory can store web server software that implements the web server. Thus, the processor 210 and the memory 212 functions as a web server that delivers the electrical characteristics data of the appliance through the internet to a client which is typically a web browser that makes a request for a specific resource using HTTP to which the web server responds with the content of that resource. Typically, the content will be password protected or accessed through a secure network or virtual private network. The resource is typically a real file, such as a database containing the electrical characteristics data of the appliance that resides in the memory 212.

The appliance network connectivity apparatus 200 also includes a relay 214 having an electrical input that is coupled to the power source 116. An electrical output of the relay 214 is coupled to the appliance 104. A control input of the relay 214 is electrically coupled to an output of the processor 210. The relay 214 controls the application of power from the power source 116 to the appliance 104. That is, when the processor 210 sends a control signal to the relay 214 that closes the relay 214, power from the power source 116 is transferred through the relay 214 to the power input of the appliance 104. Alternatively, when the processor 210 sends a control signal to the relay 214 that opens the relay 214, the power source 116 is isolated from the power input of the appliance 104. In some modes of operation according to the present teaching, the relay 214 is used to cycle the power to the appliance 104 on and off according to demand response events or at predetermined intervals for any one of numerous reasons including convenience or to take advantage of lower electrical rates.

The appliance network connectivity apparatus 200 also includes a wireless network interface 202 electrically connected to the processor 210. The wireless network interface 202 can include various network interface chipsets that can be used to implement a variety of networking standards and technologies. For example, the wireless network interface 202 can support Wi-Fi, Bluetooth, Zigbee, WiMAX, cellular, Homeplug, G.hn, Ethernet wireless standards and technology. The wireless network interface 202 contains all the necessary components to access an available LAN, WAN, CAN, MAN, or internet. For example, many home networks are Wi-Fi LANs. The wireless network interface 202 contains all the necessary components to access virtual private networks (VPN) and other secure networks. Web server software running on the processor 210 enables access and communication through the LAN, WAN, CAN, MAN, or internet. The appliance network connectivity apparatus would join the LAN, WAN, CAN, MAN, or internet in the same way any other Wi-Fi client would be added. For example, access to a LAN allows clients on the LAN (such as PCs, tablet computers, and Smartphones) to access stored data in the memory 212 or to send control signals, such as on/off signals, to the relay 214. Similarly, the web server software also facilitates communication to other networked entities outside the LAN.

The wireless network interface 202 has an input that is electrically connected to an output of the processor 210. In various embodiments, the wireless network interface 202 can receive commands from remote locations via networks including a LAN, WAN, CAN, MAN, and the internet. For example, the wireless network interface 202 can receive commands to open or close the relay 214 via the internet. Also, the wireless network interface 202 can pass electrical characteristics data stored in the memory 212, or determined by the processor 210 in real time, to the wireless network 108 and to the routing and/or switching device 118 that connects the wireless network 108 to remote locations via networks such as a LAN, WAN, CAN, MAN, and the internet. Thus, the wireless network interface 202 allows remote access to measured power (energy), voltage, and current data and to provide diagnostics information.

In addition, the wireless network interface 202 includes an output that transmits instructions to the processor 210. For example, the processor 210 can be instructed by a remote user to cycle power of the appliance 104 off and on with the relay 214. Also, the processor 210 can be instructed by a remote user or by an automated response, such as an automated demand response from a local utilities' network, to power down or to reduce energy consumption of the appliance 104. Also, the processor 210 can be instructed by a remote user or by an automated response to provide diagnostics information.

Figure 2B:
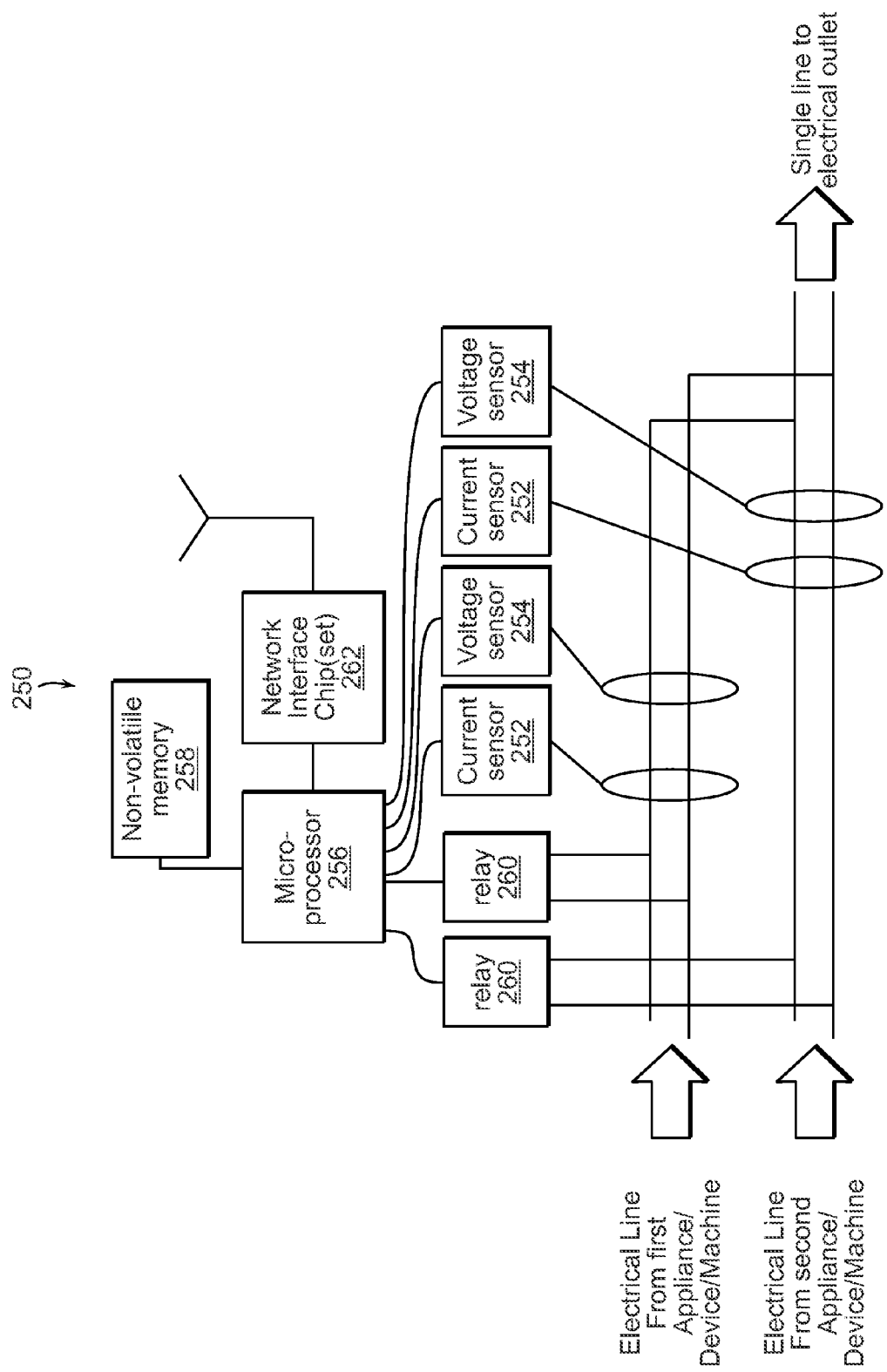
FIG. 2B is a schematic block diagram of an appliance network connectivity apparatus for connecting multiple appliances to a wireless network according to the present teaching.

FIG. 2B is a schematic block diagram of an appliance network connectivity apparatus 250 for connecting multiple appliances to a wireless network according to the present teaching. The appliance network connectivity apparatus 250 is similar to the appliance network connectivity apparatus 200 that was described in connection with FIG. 2A. However, the appliance network connectivity apparatus 250 includes hardware and software for connecting two appliances to the wireless network as shown in FIG. 1C. Referring to FIGS. 1C and 2B, in one embodiment, the appliance network connectivity apparatus 250 includes electrical receptacles 170', 170" that receive appliance power plugs 172', 172" that power the appliances 164', 164". In another embodiment, the appliance network connectivity apparatus 250 is hardwired to an electrical power source as described herein in connection with FIG. 1B.

The appliance network connectivity apparatus 250 includes a plurality of voltage sensors 252 where each of the plurality of the voltage sensors 252 is electrically coupled to one of a plurality of appliances 164, 164'. Each of the plurality of the voltage sensors 252 generates a signal at an output that is proportional to a voltage applied to a corresponding one of the plurality of appliances 164', 164". The appliance network connectivity apparatus 250 also includes a plurality of current sensors 254 where each of the plurality of the current sensors 254 is electrically coupled to one of the plurality of appliances 164', 164". Each of the plurality of the voltage sensors 252 generates a signal at an output that is proportional to a current flowing through a corresponding one of the plurality of appliances 164', 164".

A processor 256 controls the operation of the appliance network connectivity apparatus 250. The processor 256 includes a first plurality of sensor inputs electrically coupled to the output of the plurality of voltage sensors 252 and a second plurality of sensor input electrically coupled to the output of the plurality of current sensors 254. The processor 256 manages the plurality of voltage sensors 252 and the plurality of current sensors 254 by controlling the sampling of current and voltage measurements as well as storage of the current and voltage samples for each of the plurality of appliances 164', 164" in the memory 258. Thus, the processor 256 can individually manage the separate appliances so that measurements and analysis is performed for each appliance individually and their respective data samples can be stored and analyzed separately.

The processor 256 can perform multiple functions. For example, the processor 256 can determine the electrical characteristics of each of the plurality of appliances 164', 164". For example, the processor 256 can determine the power consumed by the appliance and the line voltage, both as a function of time. In addition, the processor 256 can monitor and store current. One skilled in the art will appreciate that numerous other electrical characteristics of the appliance can be determined. The processor 256 also determines appliance diagnostics information and appliance usage data.

In addition, the processor 256 or a separate processor (not shown) executes web server software that communicates the electrical characteristics data through the wireless network 168 to the routing and/or switching device 169 to the internet where it is available to a web browser. The processor 256 is electrically connected to the non-volatile memory 258 that stores the electrical characteristics data for at least some of the plurality of appliances 164', 164". The memory 258 or a separate memory can store web server software that implements the web server. Thus, the processor 256 and the memory 258 functions as a web server that delivers the electrical characteristics of at least some of the plurality of appliances 164', 164" through the internet to a client which is typically a web browser that makes a request for a specific resource using HTTP to which the web server responds with the content of that resource. Typically, the content will be password protected or accessed through a secure network or virtual private network. The resource is typically a real file, such as a database containing the electrical characteristics data of at least some of the plurality of appliances 164'. 164" that resides in the memory 258.

The appliance network connectivity apparatus 250 also includes a plurality of relays 260 where each of the plurality of relays 260 has an electrical input coupled to the power source 166 and an electrical output coupled one of the plurality of appliances 164', 164". A control input of each of the plurality of relays 260 is coupled to one of a plurality of outputs of the processor 256. The plurality of relays 260 independently controls power from the power source 166 to the plurality of appliances 164', 164". That is, when the processor 256 sends control signals to the plurality of relays 260 that closes one or more of the plurality of relays 260, power from the power source 166 is transferred through these closed relays 260 to the power input of the corresponding appliances 164', 164". Alternatively, when the processor 256 sends control signals to the plurality of relays 260 that opens one or more of the plurality of relays 260, the power source 166 is isolated from the power input of the corresponding appliances 164', 164". In some modes of operation according to the present teaching, the plurality of relays 260 is used to cycle the power to the appliances 164', 164" on and off according to demand response events, at predetermined intervals, for user convenience to take advantage of lower electrical rates, or for numerous other purposes.

The appliance network connectivity apparatus 250 also includes a wireless network interface 262 electrically connected to the processor 256. The wireless network interface 262 can include various network interface chipset that can be used to implement a variety of networking standards and technologies. For example, the wireless network interface 262 can support Wi-Fi, Bluetooth, Zigbee, WiMAX, cellular, Homeplug, G.hn, Ethernet wireless standards and technology.

The wireless network interface 262 has an input that is electrically connected to an output of the processor 256. In various embodiments, the wireless network interface 262 can receive commands from remote locations via networks such as a LAN, WAN, CAN, MAN, and the internet. For example, the wireless network interface 262 can receive commands to open or close the relays 260 via the internet. Also, the wireless network interface 262 can pass electrical characteristics data stored in the memory 258, or determined by the processor 256 in real time, to the wireless network 168 and to the routing and/or switching device 169 that connects the wireless network 168 to remote locations via networks, such as a LAN, WAN, CAN, MAN, and the internet. Thus, the wireless network interface 262 allows remote access to measured power (energy), voltage, and current data. Furthermore, the wireless network interface 262 provides diagnostics information for each of the plurality of appliances 164', 164".

In addition, the wireless network interface 262 includes an output that transmits instructions to the processor 256. For example, the processor 256 can be instructed by a remote user to cycle power of one or more of the plurality of appliances 164', 164" off and on with the corresponding relays 260. Also, the processor 256 can be instructed by a remote user or by an automated response, such as an automated demand response from a local utilities' network, to power down or to reduce energy consumption of one or more of the plurality of appliances 164', 164". Also, the processor 256 can be instructed by a remote user or by an automated response to provide diagnostics information.

In other embodiment, a plurality of single-appliance network connectivity apparatus, such as the appliance network connectivity apparatus that was described in connection with FIG. 1A is in electrical communication via the wireless network. This embodiment is shown in FIG. 1D. In yet another embodiment, a plurality of multiple-appliance network connectivity apparatus, such as the appliance network connectivity apparatus that was described in connection with FIG. 1B is in electrical communication via the wireless network.

In some methods of operating these network connectivity apparatus according to the present teaching at least one of data and control functions for each of at least two appliance network connectivity apparatus on the wireless network are made accessible on a single appliance network connectivity apparatus. Also, in some methods of operating these network connectivity apparatus according to the present teaching each of the at least two appliance network connectivity apparatus detects the presence of particular appliance network connectivity apparatus. Such features are useful for centralized monitoring and control.

In embodiments, where multiple appliance network connectivity apparatus are in communication with a wireless network, at least two appliance network connectivity apparatus can be self-organizing on a single appliance network connectivity apparatus. The term "self-organizing" as described herein refers to characteristics of a network that are self-configuring in some way. One example of self-organizing is when the at least one of data and control functions for all appliance network connectivity apparatus on the network are made accessible on at least one appliance network connectivity apparatus. Self-organizing networks can be supervised or unsupervised.

Self-organizing networks can be implemented by having each of the plurality of network connectivity apparatus recognize each other through the network. The recognition can be performed in numerous ways. For example, the recognition can be performed manually by the network administrator. Alternatively, the recognition can be performed automatically by detecting the presence of other network connectivity apparatus on the network by querying the local router(s). Each of the network connectivity apparatus can present a unique identifier that can be recognized by some or all of the other network connectivity apparatus. Alternatively, an analysis of collected voltage and current measurements can be used to identify certain network connectivity apparatus. Once the plurality of network connectivity apparatus are recognized, the separate appliances can be individually managed and their respective data samples can be stored and analyzed separately. In addition, measurements and analysis can be performed on each of the separate appliances.

Particular network connectivity apparatus can be programmed to manually or to automatically configure their communications so a single network connectivity apparatus acts as the communications interface for all the network connectivity apparatus. This allows the plurality of network connectivity apparatus to present data, control and diagnostic functionality for all appliances on the network at a single access point. For example, in the embodiment shown in FIG. 1D, the first multiple plug adapter 182' can be configured to be an aggregation point that collects data (either processed or unprocessed) from the second multiple plug adapter 182". Consequently, any network access directed toward or from the second multiple plug adapter 182" is then redirected to the first multiple plug adapter 182' where data for both the first and the second multiple plug adapters 182', 182" are available. Similarly, any control signaling directed to the second multiple plug adapter 182" is routed through the first multiple plug adapter 182' before being passed to the second multiple plug adapter 182". The first multiple plug adapter 182' continues to manage data and control for the first appliance 184' as well. In this embodiment, the first multiple plug adapter 182' is designated as the aggregator either manually or by automatic algorithms.

Thus, a method of connecting an appliance to a network according to the present teaching includes measuring a voltage across an electrical power input of an appliance and measuring a current flowing through the appliance. Electrical characteristics of the appliance are determined using a processor. The electrical characteristics include, but are not limited to, instantaneous power, resistive power, reactive power, total power, power factor, and line voltage as a function of time. In addition, the electrical characteristics include static characteristics such as current and minimum and maximum line voltage. To monitor energy usage, the processor can use the electrical characteristics to also calculate the cost of the energy used by the attached appliance as a function of time.

In some methods according to the present teaching, the processor analyzes a time series of voltage and current in order to diagnose the functioning of the appliance. One method according to the present teaching performs non-intrusive load monitoring based on the fact that the motor load variations are directly converted into electric current modulations. Analysis of the time series may provide clues to malfunctions or inefficient operation that are indicative of defects or defective operation in the appliance. Transient behaviors occurring at power on and off of the electrical loads can provide diagnostic clues. In some methods according to the present teaching, diagnosing data and analysis results are sent to an appliance vendor over the network.

By way of example, consider an electric clothes dryer. When the dryer begins its cycle, the current provided to the motor that drives the drum will exhibit a unique signature before reaching steady state. During its cycle, a heating element is activated at different power levels. By observing the collected voltage and current data as a function of time, the processor can determine if the heating element is functioning properly by comparing the resulting data to known records of a properly functioning heating element. For example, when the heating element is activated, the power consumed by the appliance will increase, resulting in higher measured current values. If the heating element fails, those higher current values will be absent from the record, indicating a failure. Similarly, analysis of the voltage and current waveforms relative to operation of such components as motors can give indication of potential or actual malfunctions.

The processor is interfaced with a network, such as a LAN, WAN, CAN, MAN, or the internet, that enables access of the electrical characteristics through a web server. Power is switched from a power source to the appliance in response to a command from the processor that is received from the network. The method can be used for connecting a plurality of appliances to the network. In some methods according to the present teaching, the methods further include instructing the processor to cycle the power applied to the appliance at discrete times or at predetermined intervals.

In some methods according to the present teaching, real time demand level data are retrieved from the network and these data are used to switch power from the power source to the appliance. In these methods, the appliance network connectivity apparatus accesses network resources, such as, but not limited to, web sites of manufacturers or power utility companies to gather information on real time energy pricing or demand levels. The term "demand" refers to the electrical load on the local electrical grid. During times of high demand, utilities will incentivize their customers to reduce consumption in order to reduce the stress on the local grid thereby limiting the need to purchase additional energy from the wholesale electricity market (with the likelihood of extremely high price volatility at times of peak demand and supply shortages) or to add additional local generation capacity. In these methods, the appliance network connectivity apparatus polls its servicing utility company to implement demand response schemes or to optimize the cost of energy by choosing to run the appliance cycles when costs are low. The processor switches the power to the appliance on or off through the relay in response to data received during the polling. External entities such as servicing utilities could also push pricing and demand information to the appliance network connectivity apparatus by messaging when rates change or when demand levels reach certain thresholds. In response to such messages, the processor on the appliance network connectivity apparatus can control operation of the appliance through the relay.

EQUIVALENTS

While the applicants' teaching is described in conjunction with various embodiments, it is not intended that the applicants' teaching be limited to such embodiments. On the contrary, the applicants' teaching encompass various alternatives, modifications, and equivalents, as will be appreciated by those of skill in the art, which may be made therein without departing from the spirit and scope of the teaching.

What is claimed is:

1. An appliance network connectivity apparatus comprising:
   a) a first appliance network connectivity apparatus comprising:
      i. a first voltage sensor electrically coupled to an output of a first power source providing power to a first appliance, the first voltage sensor generating a signal at a first voltage sensor output that is proportional to a voltage provided to the first appliance;
      ii. a first current sensor electrically coupled to the output of the first power source, the first current sensor generating a signal at a first current sensor output that is proportional to a current flowing through the first appliance;
      iii. a first processor having a first sensor input electrically coupled to the output of the first voltage sensor and a second sensor input electrically coupled to the output of the first current sensor, wherein the first processor monitors performance of the first appliance by comparing voltage and current waveforms received by the first and second sensor inputs to stored known records of proper functioning appliances, generates first performance data, and executes web server software for communicating the first performance data through a network;
      iv. a first relay having an electrical input coupled to the first power source, an electrical output coupled to the first appliance, and a first relay control input that is electrically coupled to an output of the first processor, the first relay controlling power from the first power source to the first appliance; and
      v. a first network interface electrically connected to the first processor, the first network interface providing the first performance data to the network; and
   b) a second appliance network connectivity apparatus comprising:
      i. a second voltage sensor electrically coupled to an output of a second power source providing power to a second appliance, the second voltage sensor generating a signal at a second voltage sensor output that is proportional to a voltage provided to the second appliance;
      ii. a second current sensor electrically coupled to the output of the second power source, the second current sensor generating a signal at a second current sensor output that is proportional to a current flowing through the second appliance; and
      iii. a second processor having a first sensor input electrically coupled to the output of the second voltage sensor and a second sensor input electrically coupled to the output of the second current sensor, wherein the second processor monitors performance of the second appliance by comparing voltage and current waveforms received by the first and second sensor inputs to stored known records of proper functioning appliances, generates second performance data, and executes web server software for communicating the second performance data through the network;
      iv. a second relay having an electrical input coupled to the second power source, an electrical output coupled to the second appliance, and a second relay control input that is electrically coupled to the output of the processor, the second relay controlling power from the second power source to the second appliance; and
      v. a second network interface electrically connected to the second processor, wherein the second network interface automatically detects the presence of the first appliance network connectivity apparatus on the network for the purpose of sharing data and control information comprising first and second appliance performance data and diagnostic functionality between the first and second appliance network connectivity apparatus,
   wherein the first and second appliance network connectivity apparatus self-organize by automatically designating one of the first and second appliance network connectivity apparatus on the network as an access point to other of the first and second appliance network connectivity apparatus on the network.

2. The appliance network connectivity apparatus of claim 1 wherein the web server software communicates the first and second performance data to at least one appliance vendor through the network.

3. The appliance network connectivity apparatus of claim 1 wherein the first appliance network connectivity apparatus comprises an electrical receptacle that is adapted to receive a power plug of the first appliance.

4. The appliance network connectivity apparatus of claim 1 wherein the second appliance network connectivity apparatus comprises an electrical receptacle that is adapted to receive a power plug of the second appliance.

5. The appliance network connectivity apparatus of claim 1 wherein the first appliance network connectivity apparatus is electrically connected between the first appliance and the first power source with a hardwired connection.

6. The appliance network connectivity apparatus of claim 1 wherein the second appliance network connectivity apparatus is electrically connected between the second appliance and the second power source with a hardwired connection.

7. The appliance network connectivity apparatus of claim 1 wherein the first processor determines electrical characteristics of the first appliance that comprises energy consumed.

8. The appliance network connectivity apparatus of claim 1 wherein the second processor determines electrical characteristics of the second appliance that comprises energy consumed.

9. The appliance network connectivity apparatus of claim 1 wherein the first processor determines electrical characteristics of the first appliance that comprises appliance usage data.

10. The appliance network connectivity apparatus of claim 1 wherein the second processor determines electrical characteristics of the second appliance that comprises appliance usage data.

11. The appliance network connectivity apparatus of claim 1 wherein the first processor provides internet access to at least one of electrical characteristics, performance data, processed electrical characteristics, and diagnostics analysis of the electrical characteristics through the first network interface.

12. The appliance network connectivity apparatus of claim 1 wherein the second processor provides internet access to at least one of electrical characteristics, performance data, processed electrical characteristics, and diagnostics analysis of the electrical characteristics through the second network interface.

13. The appliance network connectivity apparatus of claim 1 wherein the first network interface provides remote access to the first processor so that a remote user can control the first relay.

14. The appliance network connectivity apparatus of claim 1 wherein the second network interface provides remote access to the second processor so that a remote user can control the second relay.

15. The appliance network connectivity apparatus of claim 1 wherein the first appliance network connectivity apparatus further comprises:
  a) a plurality of voltage sensors, each of the plurality of the voltage sensors being electrically coupled to one of a plurality of appliances and generating a signal at an output that is proportional to a voltage applied to a corresponding one of the plurality of appliances;
  b) a plurality of current sensors, each of the plurality of the current sensors being electrically coupled to one of the plurality of appliances and generating a signal at an output that is proportional to a current flowing through a corresponding one of the plurality of appliances;
  c) the first processor having a first plurality of sensor inputs electrically coupled to the outputs of the plurality of voltage sensors and a second plurality of sensor inputs electrically coupled to the outputs of the plurality of current sensors, wherein the first processor monitors performance of the plurality of appliances by comparing voltage and current waveforms received by the first and second plurality of sensor inputs to stored known records of proper functioning appliances, generates performance data, and executes web server software for communicating the performance data to an appliance vendor through a network; and
  d) a plurality of relays, each of the plurality of relays having an electrical input coupled to the first power source and an electrical output coupled one of the plurality of appliances, and a control input that is coupled to an output of the first processor, the plurality of relays controlling power from the first power source to the plurality of appliances.

16. The appliance network connectivity apparatus of claim 15 wherein the first appliance network connectivity apparatus comprises a plurality of electrical receptacle adaptors that each receives one of a plurality of appliance power plugs.

17. The appliance network connectivity apparatus of claim 15 wherein the first appliance network connectivity apparatus is electrically connected between the plurality of appliances and the first power source with a hardwired connection.

18. The appliance network connectivity apparatus of claim 15 wherein the first processor determines electrical characteristics of at least one of the plurality of appliances that comprises energy consumed by the at least one of the plurality of appliances.

19. The appliance network connectivity apparatus of claim 15 wherein the performance data comprises appliance diagnostics information for at least one of the plurality of appliances.

20. The appliance network connectivity apparatus of claim 15 wherein the first processor determines electrical characteristics of at least one of the plurality of appliances that comprises appliance usage data.

21. The appliance network connectivity apparatus of claim 15 wherein the first processor provides internet access to at least one of electrical characteristics, the performance data, processed electrical characteristics, and diagnostics analysis of the electrical characteristics through the first network interface.

22. The appliance network connectivity apparatus of claim 15 wherein the first network interface provides remote access to the first processor so that a remote user can control at least one of the plurality of relays.

* * * * *